United States Patent
Zhong et al.

(10) Patent No.: US 9,466,466 B1
(45) Date of Patent: Oct. 11, 2016

(54) DETERMINATION OF SEMICONDUCTOR CHAMBER OPERATING PARAMETERS FOR THE OPTIMIZATION OF CRITICAL DIMENSION UNIFORMITY

(71) Applicant: Lam Research Corporation, Fremont, CA (US)

(72) Inventors: Qinghua Zhong, Fremont, CA (US); Ryan Martin, Berkeley, CA (US); Ganesh Upadhyaya, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/853,115

(22) Filed: Sep. 14, 2015

Related U.S. Application Data

(60) Provisional application No. 62/188,038, filed on Jul. 2, 2015.

(51) Int. Cl.
| | |
|---|---|
| *B44C 1/22* | (2006.01) |
| *C03C 15/00* | (2006.01) |
| *C03C 25/68* | (2006.01) |
| *C23F 1/00* | (2006.01) |
| *H01J 37/32* | (2006.01) |
| *H01L 21/67* | (2006.01) |
| *H01L 21/66* | (2006.01) |

(52) U.S. Cl.
CPC ... *H01J 37/32082* (2013.01); *H01L 21/67242* (2013.01); *H01L 22/12* (2013.01); *H01J 2237/334* (2013.01)

(58) Field of Classification Search
CPC .................................................... H01L 22/12
USPC ............................................................ 216/68
See application file for complete search history.

(56) References Cited

U.S. PATENT DOCUMENTS

| | | | | |
|---|---|---|---|---|
| 7,334,202 B1* | 2/2008 | Singh | ........................ | G03F 7/38 716/132 |
| 2009/0139963 A1* | 6/2009 | Panagopoulos | ....... | H01J 37/321 216/68 |

\* cited by examiner

*Primary Examiner* — Roberts Culbert
(74) *Attorney, Agent, or Firm* — Martine Penilla Group, LLP

(57) ABSTRACT

Methods, systems, and computer programs are presented for optimizing Critical Dimension Uniformity (CDU) during the processing of a substrate. One method includes identifying an operation of a recipe for processing a substrate within a chamber, the operation being configured to provide a pulsed radio frequency (RF) to the chamber. A plurality of tests are performed in the chamber for the operation utilizing the pulsed RF, each test having a duty cycle for the pulsed RF selected from a plurality of RF duty cycles. The method also includes for each test, measuring the critical dimension (CD) and the CDU for features in the substrate, and selecting a first duty cycle from the plurality of RF duty cycles based on the measured CDs and CDUs for the plurality of tests. The method also includes setting the selected first duty cycle in the operation of the recipe for processing the substrate.

20 Claims, 11 Drawing Sheets

Critical Dimension

CD and CDU testing for multiple duty cycles

| Id | Carrier | Step | Pres | TCP | Bias | Pulsing | Inj | Chemistry | Time |
|---|---|---|---|---|---|---|---|---|---|
| 04 | 100% | Dep | 12 | 600 | 160 | 20%200Hz | Edge | 105N2 / 40CF4 / 70CHF3 / 50Ar | 14" |
|  | Oxide | ML | 12 | 600 | 160 | 70%200Hz | Edge | 105N2 / 40CF4 / 70CHF3 / 50Ar | 48" |
| 05 | 100% | Dep | 12 | 600 | 160 | 20%200Hz | Edge | 105N2 / 40CF4 / 70CHF3 / 50Ar | 14" |
|  | Oxide | ML | 12 | 600 | 160 | 65%200Hz | Edge | 105N2 / 40CF4 / 70CHF3 / 50Ar | 51" |
| 06 | 100% | Dep | 12 | 600 | 160 | 20%200Hz | Edge | 105N2 / 40CF4 / 70CHF3 / 50Ar | 14" |
|  | Oxide | ML | 12 | 600 | 160 | 55%200Hz | Edge | 105N2 / 40CF4 / 70CHF3 / 50Ar | 61" |
| 07 | 100% | Dep | 12 | 600 | 160 | 20%200Hz | Edge | 105N2 / 40CF4 / 70CHF3 / 50Ar | 14" |
|  | Oxide | ML | 12 | 600 | 160 | 45%200Hz | Edge | 105N2 / 40CF4 / 70CHF3 / 50Ar | 77" |
| 12 | 100% | Dep | 12 | 600 | 160 | 20%200Hz | Edge | 105N2 / 40CF4 / 70CHF3 / 50Ar | 14" |
|  | Oxide | ML | 12 | 600 | 160 | 40%200Hz | Edge | 105N2 / 40CF4 / 70CHF3 / 50Ar | 96" |

Fig. 6

DETERMINATION OF SEMICONDUCTOR CHAMBER OPERATING PARAMETERS FOR THE OPTIMIZATION OF CRITICAL DIMENSION UNIFORMITY

CLAIM OF PRIORITY

This application claims priority from U.S. Provisional Patent Application No. 62/188,038, filed Jul. 2, 2015, and entitled "Determination of Semiconductor Chamber Operating Parameters for the Optimization of Critical Dimension Uniformity." This provisional application is herein incorporated by reference.

BACKGROUND

1. Field of the Disclosure

The present embodiments relates to methods, systems, and programs for optimizing Critical Dimension Uniformity (CDU) during the processing of a semiconductor substrate.

2. Description of the Related Art

In semiconductor manufacturing, etching processes are commonly and repeatedly carried out. While processing the wafer, a plasma is created that contains various types of radicals, as well as positive and negative ions. The chemical reactions of the various radicals, positive ions, and negative ions are used to etch features, surfaces and materials of a wafer. During the etching process, a chamber coil performs a function analogous to that of a primary coil in a transformer, while the plasma performs a function analogous to that of a secondary coil in the transformer.

In some chambers, the radio frequency (RF) provided to the coil is pulsed, which generally means the level of RF may be varied, e.g., there are times when the RF is ON and times when the RF is OFF, or the RF is alternated via the application of two different frequencies.

In some semiconductors, such as memory chips, a certain pattern is repeated over the surface of the substrate. In one operation, the pattern includes the creation of holes, and it is important that the sizes of the holes are uniform to obtain consistent performance across the different sections of the memory chip. It is desired that the chip has good intra-cell uniformity as well as overall wafer uniformity.

It is in this context that embodiments arise.

SUMMARY

Methods, devices, systems, and computer programs are presented for optimizing Critical Dimension Uniformity (CDU) during the processing of a semiconductor substrate. It should be appreciated that the present embodiments can be implemented in numerous ways, such as a method, an apparatus, a system, a device, or a computer program on a computer readable medium. Several embodiments are described below.

A system of one or more computers can be configured to perform particular operations or actions by virtue of having software, firmware, hardware, or a combination of them installed on the system that in operation cause the system to perform the actions. One or more computer programs can be configured to perform particular operations by virtue of including instructions that, when executed by data processing apparatus, cause the apparatus to perform the actions.

One general aspect includes a method including identifying an operation of a recipe for processing a substrate within a chamber, the operation being configured to provide a pulsed radio frequency (RF) to the chamber. The method also includes performing a plurality of tests in the chamber for the operation utilizing the pulsed RF, each test having a duty cycle for the pulsed RF selected from a plurality of RF duty cycles. The method also includes for each test, measuring a critical dimension (CD) value and a critical dimension uniformity (CDU) value for features in the substrate. The method also includes identifying a first range of duty cycles that corresponds to a range of CD values that includes a minimum CD value from the measured CD values in the plurality of tests, and identifying a second range of duty cycles that corresponds to a range of CDU values that includes a minimum CDU value from the measured CDU values in the plurality of tests. The method also includes selecting a first duty cycle from an overlap of the first range of duty cycles and the second range of duty cycles, and setting the selected first duty cycle in the operation of the recipe for processing the substrate.

Implementations may include one or more of the following features. The method as recited where the first range of duty cycles corresponds to duty cycles for CDU values within a range based on the minimum CDU value and a first predetermined threshold. The method may also include where the second range of duty cycles corresponds to duty cycles for CD values within a range based on the minimum CD value and a second predetermined threshold. The method as recited where the first predetermined threshold is a first predetermined percentage of the minimum CDU value and the second predetermined threshold is a second predetermined percentage of the minimum CD value. The method as recited where the operation is an etching operation for photolithography etching, where the substrate includes a plurality of holes disposed on a matrix pattern. The method as recited where the substrate is processed to create a random access memory chip, where the plurality of holes are associated with memory cells. The method as recited where the CD value is a size of a minimum feature defined in the substrate, where the CDU value is measured as a standard deviation of measurements of the CD values in features of a processed substrate. The method as recited where the substrate includes a hole, where the operation alternates deposition and etching on the hole, where during the operation the hole shrinks until a size of the hole reaches a threshold value that remains substantially stable due to a balancing effect of the etching and the deposition. The method as recited further including: tuning a ratio of gases utilized in the operation for optimizing CD values and CDU values. The method as recited where the chamber is a transformer coupled plasma (TCP) chamber, where a TCP coil over the chamber supplies the pulsed RF to the chamber. The method as recited where the operation includes injecting gases into the chamber through an edge injector, where the gases include nitrogen, CD4, CHF3, and argon. The method as recited where the duty cycle for the pulsed RF is a percentage of time that the pulsed RF is on during a signal cycle.

One general aspect includes a system including: a chamber for processing a substrate, a generator for providing pulsed radio frequency (RF) to the chamber, and a controller. The controller is configured to set parameters of the chamber and the pulsed RF for processing the substrate, and identify an operation of a recipe for processing the substrate. The controller is further configured to perform a plurality of tests in the chamber for the operation, each test having a duty cycle for the pulsed RF selected from a plurality of RF duty cycles. The controller is further configured to measure a critical dimension (CD) value and a critical dimension uniformity (CDU) value for features in the substrate for each test, identify a first range of duty cycles that corresponds to a range of CD values that includes a minimum CD value from the measured CD values in the plurality of tests, identify a second range of duty cycles that corresponds to a range of CDU values that includes a minimum CDU value from the measured CDU values in the plurality of tests, select a first duty cycle from an overlap of the first range of duty cycles and the second range of duty cycles, and set the selected first duty cycle in the operation of the recipe for processing the substrate.

One general aspect includes a non-transitory computer-readable storage medium storing a computer program. The computer-readable storage medium includes program instructions for identifying an operation of a recipe for processing a substrate within a chamber, the operation being configured to provide a pulsed radio frequency (RF) to the chamber. The storage medium also includes program instructions for performing a plurality of tests in the chamber for the operation utilizing the pulsed RF, each test having a duty cycle for the pulsed RF selected from a plurality of RF duty cycles. The storage medium also includes program instructions for measuring a critical dimension (CD) value and a critical dimension uniformity (CDU) value for features in the substrate for each test. The storage medium also includes program instructions for identifying a first range of duty cycles that corresponds to a range of CD values that includes a minimum CD value from the measured CD values in the plurality of tests. The storage medium also includes program instructions for identifying a second range of duty cycles that corresponds to a range of CDU values that includes a minimum CDU value from the measured CDU values in the plurality of tests. The storage medium also includes program instructions for selecting a first duty cycle from an overlap of the first range of duty cycles and the second range of duty cycles. The non-transitory computer-readable storage medium also includes program instructions for setting the selected first duty cycle in the operation of the recipe for processing the substrate.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 6 illustrates the chamber parameters during a testing process for determining the best duty cycle to obtain critical dimension uniformity on the substrate, according to one embodiment

DETAILED DESCRIPTION

The following embodiments describe methods, devices, systems, and computer programs for optimizing Critical Dimension Uniformity (CDU) during the processing of a semiconductor substrate. It will be apparent, that the present embodiments may be practiced without some or all of these specific details. In other instances, well-known process operations have not been described in detail in order not to unnecessarily obscure the present embodiments.

Methods, systems, and computer programs are presented for optimizing Critical Dimension Uniformity (CDU) during the processing of a substrate. A chamber is utilized to process a substrate, where the chamber includes a pulsed radio frequency (RF) generator. For a step in a recipe for processing the substrate in the chamber, a plurality of tests is performed for the step utilizing the pulsed RF, where each test has a different RF duty cycle. For each test, the critical dimension (CD) of the substrate is calculated as the average CD of the features in the substrate. Additionally, the CDU is calculated for the features in the substrate (e.g., three times the standard deviation). Afterwards, a duty cycle is selected for the step and then the selected duty cycle is set in the recipe for the processing of the substrate. The chosen duty cycle is selected in order to obtain a low CD and a low CDU, where the low CD is a CD value within a predetermined threshold amount from the minimum CD. Further, the CDU corresponding to the selected duty cycle is within a predetermined threshold amount from the minimum CDU from the tests.

Figure 1:
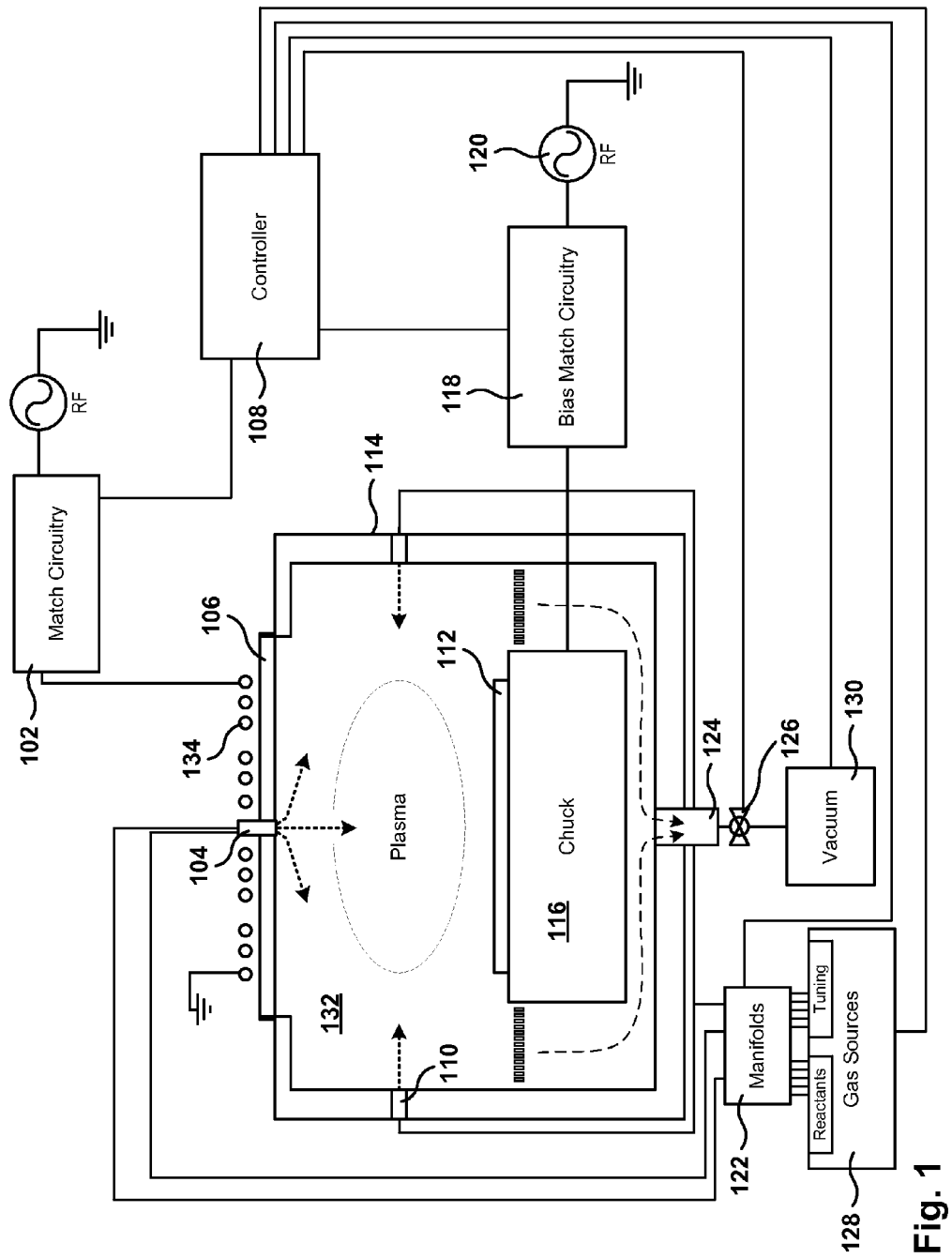
FIG. 1 is a schematic cross-section diagram showing a plasma processing system utilized for etching operations, in accordance with one embodiment of the present disclosure.

FIG. 1 is a schematic cross-section diagram showing a plasma processing system utilized for etching operations, in accordance with one embodiment. This is an exemplary chamber for processing a substrate in order to calculate the optimum duty cycle, where the optimum duty cycle provides a CD within an optimal range of CD values and provides a CDU within an optimal range of CDU values.

The system includes a chamber 132 that includes a chamber body 114, a chuck 116, and a dielectric window 106. The chuck 116 can be an electrostatic chuck for supporting a substrate 112. In some embodiments, an internal faraday shield (not shown) is disposed inside the chamber 132 beneath the dielectric window 106. A transformer-coupled plasma ("TCP") coil 134 is disposed over the dielectric window 106 and is connected to match circuitry 102.

Further shown is a bias RF generator 120, which can be defined from one or more generators. If multiple generators are provided, different frequencies can be used to achieve various tuning characteristics. A bias match circuitry 118 is coupled between the bias RF generator 120 and a conductive plate of the assembly that defines the chuck 116. The chuck 116 also includes electrostatic electrodes to enable the chucking and dechucking of the wafer. Broadly, a filter and a DC clamp power supply can be provided. Also, other control systems for lifting the wafer off of the chuck 116 can be provided.

A first gas injector 104 provides two different gas channels to inject two separate streams of process gases to the chamber 132 from the top of the chamber 132. It should be appreciated that multiple gas supplies may be provided for supplying different gases to the chamber 132 for various types of operations, such as process operations on wafers, waferless autocleaning operations, and other operations. A second gas injector 110 provides another gas stream that enters the chamber 132 through the side instead of from the top.

Gas sources 128 include a plurality of gas sources that can be mixed through manifolds 122. The gas sources include one or more reactant gases (also referred to herein as main gases) and one or more tuning gases. A reactant gas is an active gas used for etching, and the reactant gas is a source of the species necessary for etching over the substrate. Examples of reactant gases include $Cl_2$, HBr, and $SF_6$, but other reactant gases may also be used.

A tuning gas is a gas used to tune (i.e., control) the on-wafer performance. The tuning gas is used to control the dissociation pattern between gases being injected into the chamber 132. For example, the tuning gas may be used to change the ratio of ions to neutral etchants. The tuning gas controls the dissociation pattern in the chamber 132 in two ways: first, by controlling dissociation patterns of the gases in the chamber 132, and second, by controlling the spatial distribution of gas mixtures within the chamber 132, depending on how the tuning gas is injected into the chamber 132. Examples of tuning gases include oxygen, helium, argon, and methane, but other tuning gases may also be used.

In the embodiment of FIG. 1, up to three different independent gas streams are provided into the chamber 132. The first gas stream may be injected through the center of first gas injector 104, and this gas stream is referred to herein as the center stream or the inner stream. The second gas stream may be injected also through the first gas injector 104 but on a different path that surrounds the center stream, and this second gas stream is referred to as the edge stream or the outer stream. The third gas stream may be injected into the side of the chamber 132 via the second gas injector 110, and this third gas stream is referred to herein as the side gas stream.

Manifolds 122 control which gases are supplied to each of the three different gas streams. Manifolds 122 allow for any type of gas (reactant or tuning) to be provided to any of the three different gas streams. The gases may be sent without mixing, or be mixed with other gases for feeding the three different independent gas streams.

A vacuum pump 130 is connected to the chamber 132 to enable vacuum pressure control and removal of gaseous byproducts from the chamber 132 during operational plasma processing. A valve 126 is disposed between exhaust 124 and the vacuum pump 130 to control the amount of vacuum suction being applied to the chamber 132.

The dielectric window 106 can be defined from a ceramic type material. Other dielectric materials are also possible, so long as they are capable of withstanding the conditions of a semiconductor etching chamber. Typically, chambers operate at elevated temperatures ranging between about 50 Celsius and about 200 Celsius. The temperature will depend on the etching process operation and specific recipe. The chamber 132 may also be operated at vacuum conditions in the range of between about 1 m Torr (mT) and about 500 m Torr (mT). Although not all specifically shown, chamber 132 is typically coupled to facilities when installed in a clean room, or a fabrication facility. Facilities include plumbing that provide processing gases, vacuum, temperature control, and environmental particle control.

These facilities are coupled to chamber 132, when installed in the target fabrication facility. Additionally, chamber 132 may be coupled to a transfer chamber that enables robotics to transfer semiconductor wafers into and out of chamber 132 using typical automation.

A programmable controller 108 is provided for controlling the operation of the chamber 132 and its associated components. Broadly speaking, the controller 108 can be programmed to execute a chamber operation defined by a recipe. A given recipe may specify various parameters for the operation, such as the application of power to the TCP coils, the flow of gas into the chamber 132, and the application of vacuum. It should be appreciated that the timing, duration, magnitude, or any other adjustable parameter or controllable feature can be defined by a recipe and carried out by the controller 108 to control the operation of the chamber 132 and its associated components. Additionally, a series of recipes may be programmed into the controller 108.

FIGS. 2A-2D illustrate examples of critical dimensions, as used in this application according to one embodiment. Photolithography is a process used to pattern parts of a thin film or the bulk of a substrate. Photolithography uses light to transfer a geometric pattern from a photomask to a light-sensitive chemical "photoresist" on the substrate. Once the photoresist is developed or patterned, one or more etching operations are performed to form features in areas not covered by patterned photoresist.

Figure 2A:
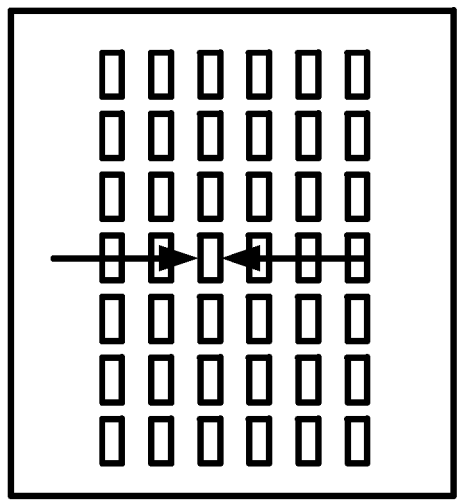
FIGS. 2A-2B illustrate the examples of critical dimensions, as used in this application according to one embodiment.
Figure 2B:
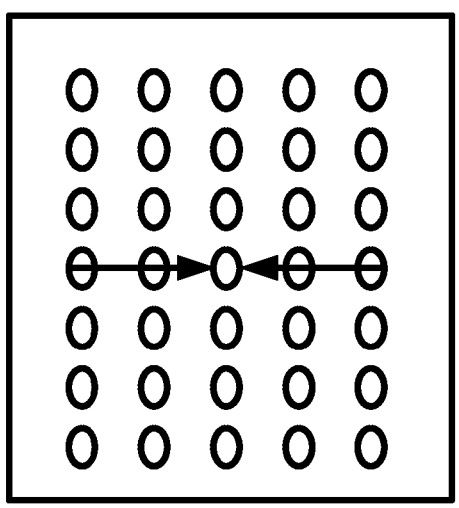

FIG. 2A illustrates a pattern to be etched on a substrate. In this example, the pattern is for a memory chip having bit storage elements, such as an SRAM memory chip, where holes are created into certain layers to provide connectivity to respective bit storage elements. In one embodiment, the holes are arranged in a matrix pattern as illustrated in FIGS. 2A and 2B. It should be understood that the patterns or shapes etched need not be for memory chips, which have regular patterns. Instead, the embodiments described herein may be applicable to any geometric shape that is etched into any material, material layer, stack of layers, etc., and the geometric shapes need not be regularly arranged. For instance, in general logic designs, features include many more non-regular routed lines, connections, vias, etc. Any one of these applications, therefore, may benefit from the optimized selection of duty cycle for etching operations.

In semiconductor manufacturing, a critical dimension of a feature is commonly understood to be a minimum feature size that can be safely manufactured for a process node. A process node, for example, may define the critical dimension in terms of size, e.g., such as 65 nm (nanometer), 45 nm, 32 nm, 22 nm, 14 nm, 10 nm, 7 nm, 5 nm, etc., nodes. Often, the critical dimension for a process node refers to a feature size, a line width, a space between features, a transistor gate, a contact hole, etc. For description purposes, embodiments are presented herein with reference to the critical dimension for the size of a contact hole that has been etched into one or more layers, but the same principles may be utilized for other features in the substrate that may be associated with a critical dimension. In accordance with this example, the critical dimension is the smallest dimension of a hole (e.g., the smallest segment connecting opposite sides of the hole and crossing through the center), and the size of the hole may be referred to as the CD of the hole.

Typically, even for processing that exhibits good etch uniformity, there may still be variations between CDs of etched holes within a die. Variations of CDs of holes within a die, therefore can be measured to identify a mathematical mean of the CD values. When the CD values are measured for the features within a specific die on a wafer surface, the mathematical mean of the CD values is referred to as the CD of the die (or intra-die CD).

As mentioned above, features can be etched to have many different geometric patterns. In this regard, when reference is made to holes, it should be understood that the hole shapes can have many different shapes, such as a square, a rectangle, an oval, a circle, etc. The type of holes formed and the arrangement will vary depending on the design being manufactured, and thus, the designs can vary widely. FIG. 2A illustrates holes with a rectangular shape, and the critical dimension of these holes is the width of the rectangle because the width is the smallest dimension of the rectangle. FIG. 2B illustrates holes having an oval shape and the critical dimension is the width of the oval.

During processing, the size of the holes may vary, and there can be a lack of uniformity in the hole size for all the holes in the pattern. Critical Dimension Uniformity (CDU) is a measurement of the uniformity of the CD of the holes formed in one or more layers of a substrate. In one embodiment, CDU is measured as three times the standard deviation ($3\sigma$) of the CD of the holes in the substrate. In addition, the CDU may be measured for a region of the substrate, which is referred to herein as a cell (e.g., a die, or an area within the die). In one embodiment, the CDU of a cell, or intra-cell CDU, is three times the standard deviation ($3\sigma$) of the CD of the holes in the cell. But any other type of statistical measurement may be used to measure the uniformity of CD of the holes. In another embodiment, the CDU is measured by measuring the CD of a statistically significant number of holes and then calculating the standard deviation for those measurements.

The 3-sigma uniformity metric CDU quantifies a standard deviation of measurements of the hole size on the wafer (wafer CDU) or on a cell (intra-cell CDU). By way of example, the 3-sigma can be an expression of the deviations in hole sizes across the wafer detected by an array of measurement points across the wafer.

The standard deviation of the hole size is determined by taking the square root of the average of the squared deviations of the hole-size values from their average hole-size value, according to the following equation:

$$\sigma = \sqrt{\frac{\sum (x - \bar{x})^2}{N}}$$

Where $\sigma$ is the standard deviation, x is the hole size, $\bar{x}$ is the mean of the hole sizes, and N is the number of hole-size samples. In one embodiment, CDU is measured as 3 times $\sigma$, but other embodiments may utilize other values, such as $\sigma$, $2\sigma$, $\sigma^2$, etc. A typical 3-sigma metric of a wafer is reported as a percentage of uniformity (0% being ideal). The 3-sigma metric is also often referred to as the WIWNU metric (within wafer nonuniformity).

More details for the calculation of statistical parameters related to features on a processed substrate are provided in U.S. Pat. No. 6,922,603, titled "System and method for quantifying uniformity patterns for tool development and monitoring," issued Jul. 26, 2005, and U.S. Pat. No. 7,239,737, titled "User interface for quantifying wafer non-uniformities and graphically explore significance," issued Jul. 3, 2007, all of which are incorporated herein by reference.

As a result of processing the substrate, the size of holes may change in different degrees. For example, in one embodiment, a 40 nm hole may shrink to about 30 nm or to some other value in the range from 5 to 30 nm. In another example, a 20 nm hole may be reduced to a hole with a CD in the range from 5 to 15 nm.

Figure 3A:
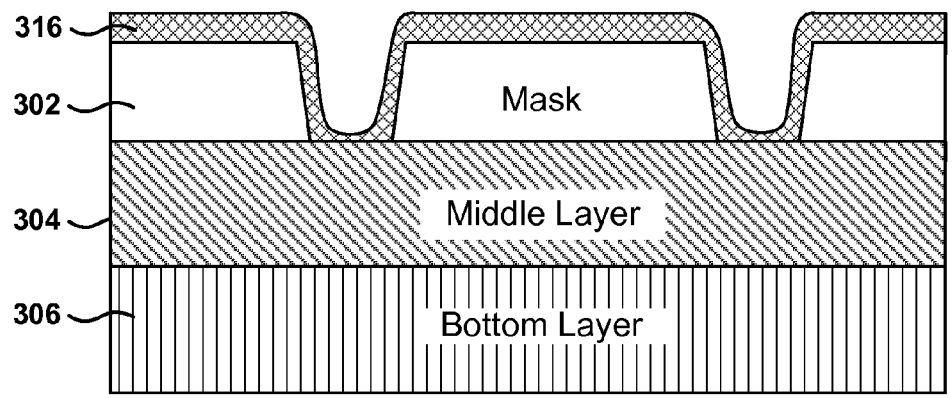
FIG. 3A illustrates a substrate after a deposition operation, according to one embodiment.

FIG. 3A illustrates a substrate after a deposition operation, according to one embodiment. In one embodiment, the substrate includes a semiconductor layer (or middle layer) 304 (e.g., silicon), which is on top of a bottom layer 306 (e.g., carbon). Afterwards, a top layer (or mask) 302 is added, where the top layer 302 may be a photoresist mask. After the mask 302 is added, a deposition operation causes a deposition layer 316 to be added on top of the existing layers.

It should be understood that the specific layers and number of layers can change depending on the application. In some cases, etching can be performed on a single material layer, directly into the silicon substrate, through multiple material layers, etc.

Figure 3B:
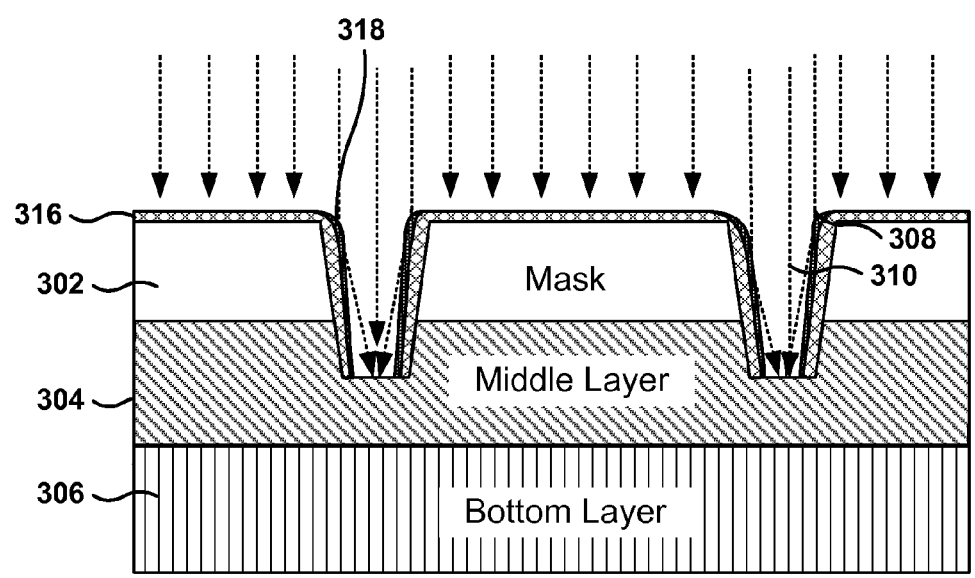
FIG. 3B illustrates an example etching process on a substrate, according to one embodiment.

FIG. 3B illustrates an example etching process on a substrate, according to one embodiment. For purposes of the example, a process can be configured to etch the holes. In some processes, the etching tool alternates between etching and deposition, when forming holes defined by the mask 302. Because of the deposition, the size of the hole may shrink during certain operations. Further, because of the pulsed RF, deposition and etching may alternate, causing etching at the bottom of the holes while causing deposition on the top (e.g., layer 318) that causes the holes to shrink.

In one embodiment, etching operations are carried out in a plasma chamber, e.g., such as the one illustrated in FIG. 1. In order to process an etch operation, a recipe is defined. The recipe will define various chamber parameters, process gas flow rates, operation times, power settings, pressure, etc. In addition, some plasma chambers can be optimized to operate in a pulsed RF power delivery mode. A pulsed RF power delivery mode means that an RF generator will pulse the delivery of power to an electrode of the plasma chamber, e.g., TCP coil 134 of FIG. 1. In one embodiment, the duty cycle of the pulsing RF source may be changed, where the duty cycle is the percentage of one period in which the RF signal is active. The duty cycle setting is, in one embodiment, defined as part of a recipe utilized to etch features, e.g., such as the aforementioned holes.

In general, a high duty cycle will have more plasma etching than a low duty cycle, which means that in the high duty cycle there is more etching and less deposition, while in a low duty cycle there is more deposition (and conversely less etching) causing the CD to shrink.

In one exemplary etching operation, gas is introduced into the chamber and a plasma is struck utilizing the pulsed RF power source. The plasma generates ions that are directed towards the substrate and the ions cause the etching on the areas of the surface not protected by the photoresist material. Since there is no photoresist covering the holes, some ions (e.g., ion 310) enter the hole and etch the bottom of the hole.

Since the sides of the holes may not be perfectly vertical, some ions may enter the hole (e.g., ion 310) and bounce off a side wall before reaching the bottom and cause etching on the bottom surface. In another scenario, some ions may even bounce or zigzag between the side walls of the hole before reaching the bottom.

Figure 3C:
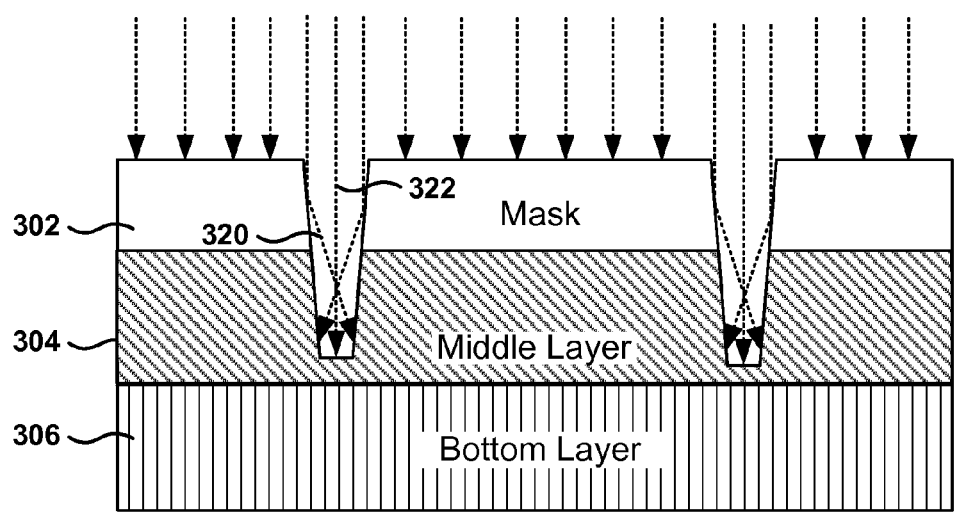
FIG. 3C illustrates the bouncing of ions on the walls of a hole when the hole is small, according to one embodiment.

FIG. 3C illustrates the bouncing of ions on the side walls of a hole when the hole is small, according to one embodiment. The holes may shrink over time as material is deposited around the top of the holes, the sides of the holes, and the bottom of the holes. FIG. 3C illustrates the change in the size of the holes after a deposition operation is performed on the substrate of FIG. 3B (the deposition layer has been omitted for clarity of description, and the amount of deposition materials may change over time as deposition alternates with etching).

The holes in FIG. 3C are smaller than the holes in FIG. 3B, and when etching is performed following the deposition, fewer ions (e.g., ion 322) will enter the smaller holes, which results in a smaller etching effect in the smaller holes.

Further, when the holes are smaller, some of the reactive ions coming down may bounce off one side wall (e.g., ion 320) and reach the opposite side wall of the hole. In another scenario, some reactive ions may bounce or zigzag between the side walls of the hole. This result is the etching of the sides of the hole, and the size of the hole will increase during the etching cycle.

Without wishing to be bound by theory, it is believed that sidewall deposition dominates when the hole is large, and sidewall etching dominates when the hole is smaller. At some point, a dynamic equilibrium is obtained when the etching and the deposition compensate each other, and the size of the hole remains substantially unchanged. There are two competing factors, deposition making the hole smaller, and etching making the hole bigger. If the hole shrinks to a certain value, then the ions can bounce off one side wall to the other side wall and start etching the side walls of the hole, stopping the hole from shrinking further.

Figure 4A:
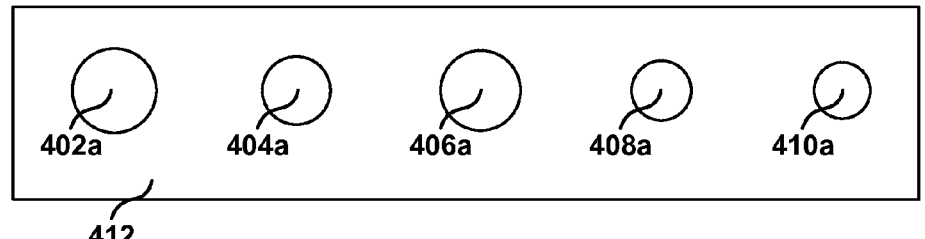
FIGS. 4A-4D illustrate the evolution of the CD size for a plurality of features, according to one embodiment.

FIGS. 4A-4D illustrate the evolution of the CD size for a plurality of features, according to one embodiment. FIG. 4A shows a plurality of holes 402a-410a in substrate 412 at the beginning of an etching operation in the chamber utilizing a pulsed RF power. The holes have different sizes in the exemplary embodiment, with some bigger holes (e.g., holes 402a and 406a) and some smaller holes (e.g., holes 408a and 410a).

If the hole is large then the hole will shrink faster, and if the hole is small then the hole will shrink slower. At some threshold hole-size value, the hole will stop shrinking when the hole reaches this threshold hole-size value.

Figure 4B:
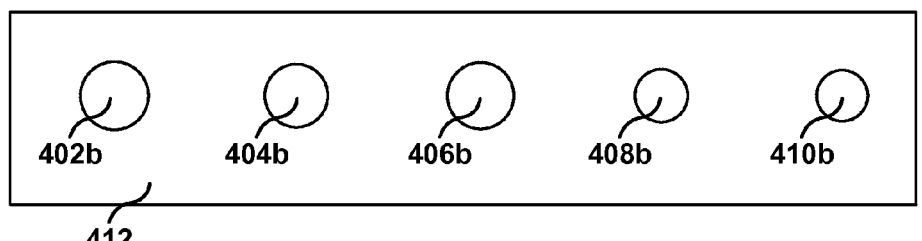

FIG. 4B illustrates substrate 412 after some time have elapsed in the etching operation. The holes 402b-410b have shrunk, but the larger holes tend to shrink (e.g., holes 402b and 406b) faster than the smaller holes 408b and 410b. This is because there is relatively more deposition than etching in the larger holes 402b and 406b than in the smaller holes 408b and 410b.

When the hole size shrinks to a certain size, there is a balance between etching and deposition, and the hole will not appreciably shrink any further. At this point, the CD becomes stable because the two factors (etching and deposition) balance each other out. The CD of the hole when the equilibrium is reached is referred to herein as the intrinsic CD or the intrinsic CD size. It is believed that, at the intrinsic CD size, the hole cannot appreciably shrink any further, but holes with a CD bigger than the intrinsic CD will continue to shrink.

Figure 4C:
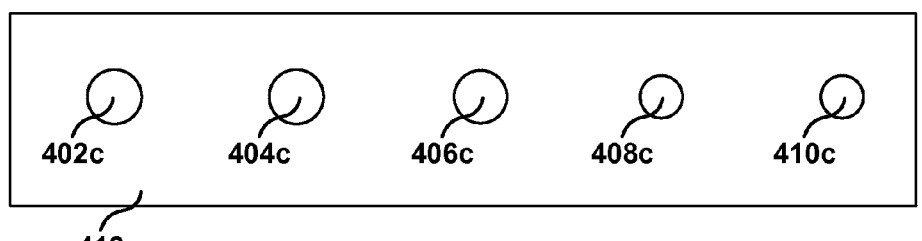

FIG. 4C illustrates substrate 412 after more time have elapsed in the etching operation illustrated in FIG. 4B. In this case, the holes keep shrinking, but holes 408c and 410c have reached the intrinsic CD size. It has been observed that when the holes reach the intrinsic CD value, the CDU is small, which means that the CD sizes have a small variation. The CDU (i.e., the standard deviation of the hole sizes) is small and within a predefined optimum range. Therefore, embodiments presented herein identify a duty cycle that substantially provides the intrinsic CD as a result of the etching and deposition operations, which results in a small CDU across the wafer and across the cell.

It is believed that the rate of shrinking of the hole is a function of its size, therefore, larger holes will shrink faster than smaller holes. As the hole becomes smaller, the shrinking rate decreases, until an equilibrium is found when the hole reaches substantially the intrinsic CD value. This means that there is a convergence on the size of the holes. For example, if initially there are holes of multiple sizes, the larger holes will shrink faster and the smaller holes will shrink slower.

The holes will continue shrinking until the intrinsic CD value is reached, and then the holes will stop shrinking appreciably (or the size of the holes will remain relatively constant or stable). Since the holes stop changing in size around the intrinsic CD value, the CD uniformity is good because the holes tend to stabilize when they reach this intrinsic CD value. By using this property, it is possible to obtain intra-cell CD uniformity across the cell, or intra-wafer CD uniformity across the wafer.

Figure 4D:
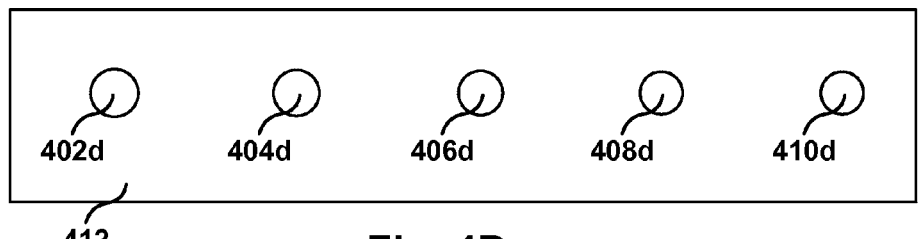

FIG. 4D illustrates substrate 412 after more time has elapsed in the etching operation illustrated in FIG. 4C. When compared to FIG. 4C, the small holes 408d and 410d have not appreciably shrunk further, because they are already at the intrinsic CD size. However, the originally larger holes 402d and 406d have shrunk further and have also substantially reached the intrinsic CD size. As a result, all the holes have now a similar size and there is a better uniformity in hole size than in the original substrate illustrated in FIG. 4A.

Embodiments presented herein utilize this property, where the holes will not shrink beyond the intrinsic CD size, to identify a duty cycle that provides this intrinsic CD as well good CD uniformity. In one embodiment, the processing operation is performed multiple times, each time with a different duty cycle. Then an examination is made of the results of the processing operation to identify the CD and the CDU, and the best or most optimal duty cycle is selected to obtain a small CD value with a small CDU. More details are provided below with reference to FIGS. 5A and 5B for the test results.

It is noted that the embodiments illustrated in FIGS. 3A-3C and 4A-4D are exemplary. Other embodiments may utilize different features, different hole distribution, different chambers, etc. The embodiments illustrated in FIGS. 3A-3C and 4A-4D should therefore not be interpreted to be exclusive or limiting, but rather exemplary or illustrative.

Figure 5A:
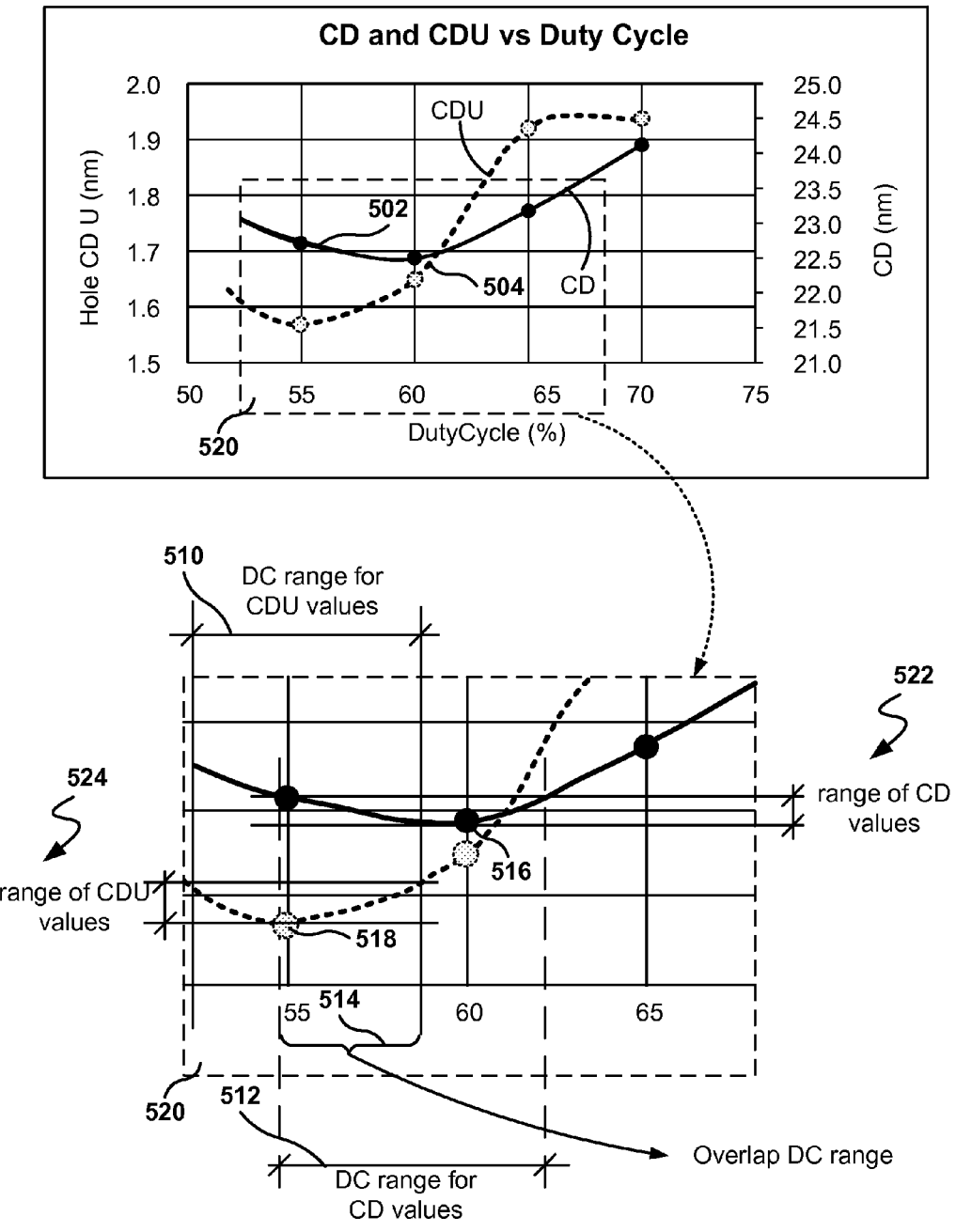
FIGS. 5A-5B are test results for critical dimension (CD) and critical dimension uniformity (CDU) as a function of the duty cycle, according to one embodiment.
Figure 5B:
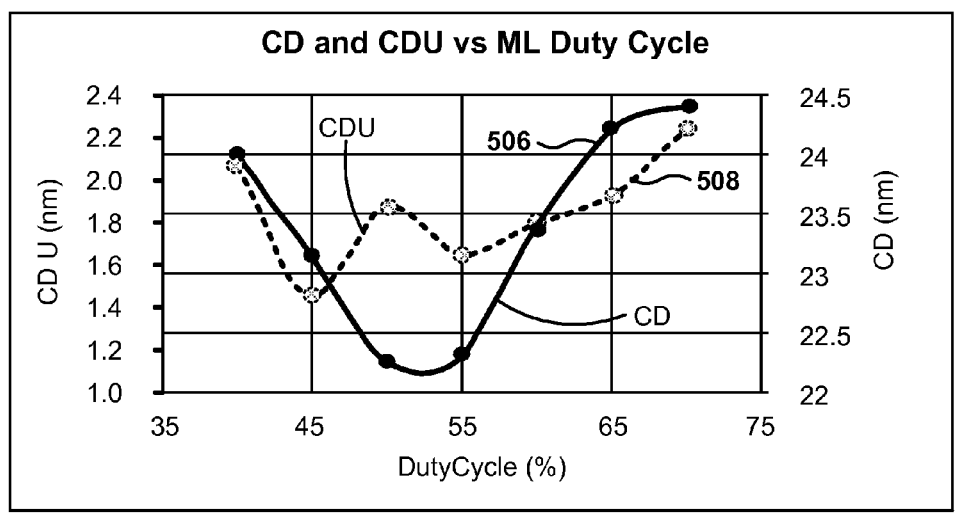

FIGS. 5A-5B are test results for critical dimension (CD) and critical dimension uniformity (CDU) as a function of the duty cycle, according to one embodiment. FIG. 5A is a chart illustrating the results obtained after performing a processing operation on the substrate utilizing different duty cycles.

Line 502 represents the average CD of the holes at the end of the processing operation, and line 504 represents the CD uniformity for the holes. At some range of duty cycles, there is an optimum CD which is the minimum CD 516 or a CD near the minimum CD 516, and a small CDU (i.e., the 3σ is small) which is the minimum CDU 518 or a CDU near the minimum CDU 518.

The bottom of FIG. 5A includes an amplified section 520 of the chart. In this exemplary test, results show that the CD reaches a minimum size 516 around a 60% duty cycle and then the CD grows as the duty cycle is increased. The CDU line 504 shows that CDU reaches a minimum 518 around the 55% duty cycle and then the CDU grows as the duty cycle increases.

The goal is to select a duty cycle that provides a small CD and a small CDU, but the minimum values of CD and CDU may not align for the same duty cycle. In the case where the CD minimum and the CDU minimum were aligned for a certain duty cycle, then this duty cycle would be chosen because it would provide the minimum CD and the minimum CDU. However, in many cases, the minimums will not line up, so a duty cycle should be selected that provides a low CD and a low CDU, although not necessarily the minimum values. From the chart, it can be observed that the minimum CD 516 is about 22.5 nm for a duty cycle of 60%, and the minimum CDU 518 is about 1.58 nm for a duty cycle of about 55%. Additionally, the chart shows that utilizing a duty cycle between 55% and 60% will result in a small CD (the minimum CD or CD value near the minimum) and a small CDU (the minimum CDU or a CDU value near the minimum CDU).

In one embodiment, the selection of the duty cycle to be set for this operation in the recipe is performed in three operations. In the first operation, a first range 510 of duty cycles is determined that is associated with a range of CDUs 524 that is defined around the minimum CDU 518. For example, first range 510 of duty cycles is between about 50% and about 59% corresponding to CDUs between about 1.57 nm and 1.62 nm.

In the second operation, a second range 512 of duty cycle values is determined that is associated with a range of CDs 522 that is defined around the minimum CD 516. For example, second range 512 of duty cycles is between about 54% and about 62% corresponding to CDs between about 22.5 nm and 22.8 nm.

In the third operation, the first range 510 and the second range 512 are compared to identify the overlap range 514 of the first range 510 and the second range 512 (i.e., the duty cycle values that overlap the first range 510 and the second range 512), and then a duty cycle is selected from within this overlap range 514. In one embodiment, the duty cycle is selected from overlap range 514 that provides the smallest CD, and in another embodiment, the duty cycle is selected from overlap range 514 that provides the smallest CDU. In yet another embodiment, a duty cycle is selected from overlap range 514 that provides the best balance between CD and CDU. The result is a duty cycle that when used in this processing operation will provide a small CD and a small CDU.

In another embodiment, when CD size is important, a duty cycle is selected that provides the minimum CD, or a value within a predetermined threshold from the minimum CD, and that provides a CDU within a predetermined allowable range. For example, if the duty cycle for the minimum CD results in a CDU within 5% of the minimum CDU, then this duty cycle is selected. If not, the duty cycle that results in the smallest CD and a CDU within the 5% of the minimum CDU will be selected.

In yet another embodiment, where the goal is to have the best CDU possible, a duty cycle is selected that provides the best CDU as long as the CD is within a predetermined allowable range. If the CD is not within the predetermined allowable range, then the duty cycle selected is the duty cycle that provides the best CDU as long as the CD is within the predetermined allowable range.

FIG. 5B illustrates the results from another plurality of tests performed in connection with an exemplary testing process. Details on the testing process are provided below with reference to FIG. 6. These tests also show that the CD 506 has a minimum value around a duty cycle of 52%. The CDU 508 has a low value around 45%, but it shows low CDU between 45 and 60%. It is believed that the small peak in the CDU chart around 50% is a result of the testing, but other tests would show a smaller CDU around 50%.

Therefore, a duty cycle between 50 and 55% will provide a small CD and a small CDU. If CDU is more important for some operations, the duty cycle may be selected around 45% where the CDU is at a minimum and the CD size is still small.

In one embodiment, the determination of the optimal range for the CD or the CDU may be obtained by examining the slope of the curve at the different points. When the change in the slope goes beyond a predetermined threshold, then a boundary for the range is determined. This means that the chosen duty cycle will be within a predetermined threshold amount from the minimum CD or CDU.

In another embodiment, the allowable duty cycle range corresponds to CD values between 10% above and 10% below the minimum CD. Other predetermined thresholds may be utilized, such as percentage values in the range from ±5% to ±25%.

In one embodiment, the convergence of the CD and CDU curves may be further tuned by adjusting parameters in the chamber so the minimum of the CD is substantially at the same duty cycle as the minimum of the CDU. Some ways to tune the convergence of the curves include changing the voltage on the RF, or changing the ratios of the gases, or changing the gases utilized in the recipe, or changing the processing time.

FIG. 6 illustrates the chamber parameters during a testing process for determining the best duty cycle to obtain critical dimension uniformity on the substrate, according to one embodiment. The testing process included a deposition operation with the duty cycle of 20% at 1200 Hz, and a second etching operation with the duty cycle that was changed for each of the tests (e.g., 70%, 65%, 55%, 45%, and 40%).

The chart illustrates that the carrier was 100% oxide, the pressure was 12 Torr, the temperature (e.g. TCP) 600, and the bias on the bottom of 160V. A number of different gases were injected through an edge injector, and the chemistry for the different gases, measured in SCCMs (Standard Cubic Centimeters per Minute), was 105 $N_2$, 40 $CF_4$, 70 $CHF_3$, and 50 Ar. The chart also illustrates the timing in seconds for each of the operations. The results of the aforementioned testing process are presented in the chart of FIG. 5B.

Figure 7A:
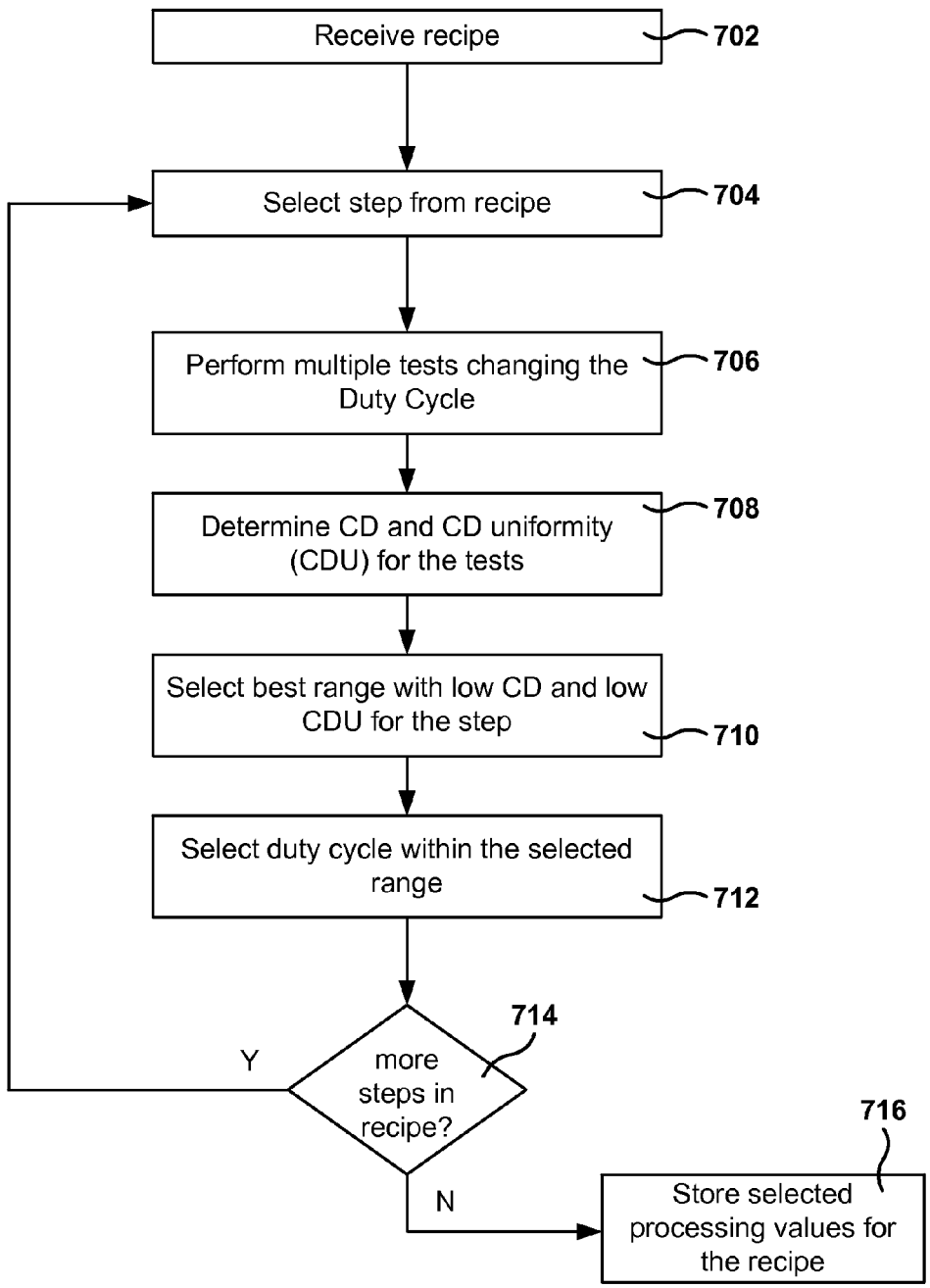
FIG. 7A is a flowchart of a method for identifying the duty cycles during one or more operations defined within the recipe for processing a semiconductor substrate, according to one embodiment.

FIG. 7A is a flowchart of a method for identifying the duty cycles during one or more operations defined within the recipe for processing a semiconductor substrate, according to one embodiment. While the various operations in this flowchart are presented and described sequentially, one of ordinary skill will appreciate that some or all of the operations may be executed in a different order, be combined or omitted, or be executed in parallel.

For each process of the recipe, the method described above may be repeated to obtain the desired CD and CDU for each operation. In operation 702, a recipe is identified and received by the controller. From operation 702, the method flows to operation 704 where a step from the recipe is selected with the purpose of identifying the best duty cycle for obtaining the best values for CD and CDU of the features in the substrate.

In operation 706, multiple tests are performed changing the duty cycle. From operation 706, the method flows to operation 708 where the average CD and the CDU for the multiple tests are determined. It is noted that in other embodiments, the CD may also be measured by taking the median of the CD values for all the holes, or some other statistical measurement.

From operation 708, the method flows to operation 710 where the best range of duty cycles is selected, where the selected range provides low CD values and low CDU values. In one embodiment, the allowable low CD values are CD values within a predetermined value amount from the minimum CD, and the allowable low CDU values are CDU values within a predetermined value amount from the minimum CDU.

From operation 710, the method flows to operation 712 where a duty cycle is selected from within the best range identified in operation 710. The selected duty cycle for this step is then set for the recipe. From operation 712, the method flows to operation 714 where a check is made to determine if there are more steps in the recipe for determining the corresponding duty cycle(s). If there are more steps, the method flows back to operation 704, and if there are no more steps the method flows to operation 716. In operation 716, the selected duty cycle(s) for the tested step(s) are stored in the recipe, which may then be used for processing a substrate.

Figure 7B:
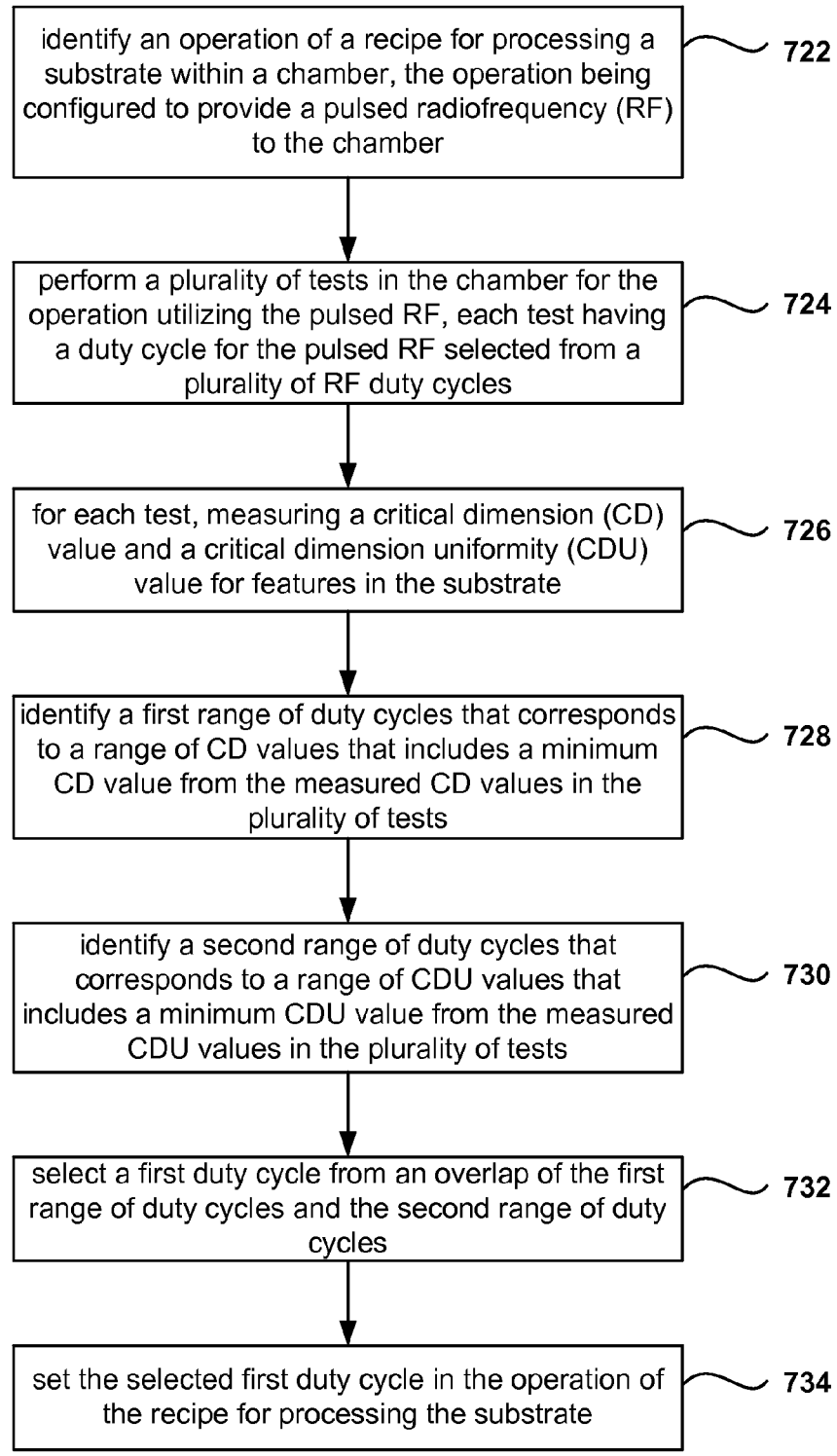
FIG. 7B is a flowchart of a method for optimizing critical dimension uniformity, according to one embodiment.

FIG. 7B is a flowchart of a method for optimizing critical dimension uniformity, according to one embodiment. While the various operations in this flowchart are presented and described sequentially, one of ordinary skill will appreciate that some or all of the operations may be executed in a different order, be combined or omitted, or be executed in parallel.

In operation 722, an operation of a recipe is identified. The operation is for processing a substrate within a chamber, and the operation is configured to provide a pulsed radio frequency (RF) to the chamber. From operation 722, the method flows to operation 724 where a plurality of tests in the chamber for the operation are performed utilizing the pulsed RF, each test having a duty cycle for the pulsed RF selected from a plurality of RF duty cycles.

From operation 724, the method flows to operation 726 where for each test, a critical dimension (CD) value and a critical dimension uniformity (CDU) value are measured for features in the substrate. From operation 726, the method flows to operation 728 for identifying a first range of duty cycles that corresponds to a range of CD values that includes a minimum CD value from the measured CD values in the plurality of tests.

From operation 728, the method flows to operation 730 for identifying a second range of duty cycles that corresponds to a range of CDU values that includes a minimum CDU value from the measured CDU values in the plurality of tests. From operation 730, the method flows to operation 732 for selecting a first duty cycle from an overlap of the first range of duty cycles and the second range of duty cycles. In operation 734, the selected first duty cycle is set in the operation of the recipe for processing the substrate.

Figure 8:
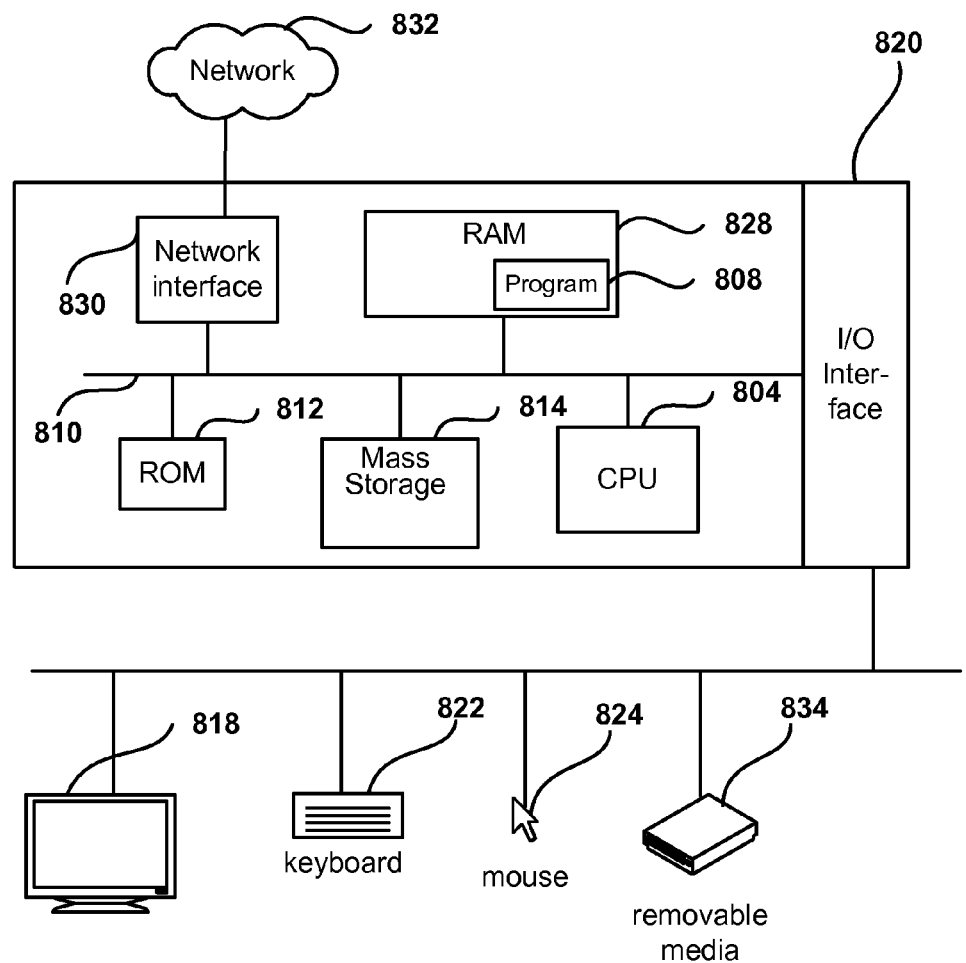
FIG. 8 is a simplified schematic diagram of a computer system for implementing embodiments.

FIG. 8 is a simplified schematic diagram of a computer system for implementing embodiments. It should be appreciated that the methods described herein may be performed with a digital processing system, such as a conventional, general-purpose computer system. Special purpose computers, which are designed or programmed to perform only one function may be used in the alternative. The computer system includes a central processing unit (CPU) 804, which is coupled through bus 810 to random access memory (RAM) 806, read-only memory (ROM) 812, and mass storage device 814. System controller program 808 resides in random access memory (RAM) 806, but can also reside in mass storage 814.

Mass storage device 814 represents a persistent data storage device such as a floppy disc drive or a fixed disc drive, which may be local or remote. Network interface 830 provides connections via network 832, allowing communications with other devices. It should be appreciated that CPU 804 may be embodied in a general-purpose processor, a special purpose processor, or a specially programmed logic device. Input/Output (I/O) interface provides communication with different peripherals and is connected with CPU 804, RAM 806, ROM 812, and mass storage device 814, through bus 810. Sample peripherals include display 818, keyboard 822, cursor control 824, removable media device 834, etc.

Display 818 is configured to display the user interfaces described herein. Keyboard 822, cursor control 824, removable media device 834, and other peripherals are coupled to I/O interface 820 in order to communicate information in command selections to CPU 804. It should be appreciated that data to and from external devices may be communicated through I/O interface 820. The embodiments can also be practiced in distributed computing environments where tasks are performed by remote processing devices that are linked through a wire-based or wireless network.

Embodiments may be practiced with various computer system configurations including hand-held devices, microprocessor systems, microprocessor-based or programmable consumer electronics, minicomputers, mainframe computers and the like. The embodiments can also be practiced in distributed computing environments where tasks are performed by remote processing devices that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more embodiments can also be fabricated as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

What is claimed is:

1. A method comprising:
    identifying an operation of a recipe for processing a substrate within a chamber, the operation being configured to provide a pulsed radio frequency (RF) to the chamber;
    performing a plurality of tests in the chamber for the operation utilizing the pulsed RF, each test having a duty cycle for the pulsed RF selected from a plurality of RF duty cycles;
    for each test, measuring a critical dimension (CD) value and a critical dimension uniformity (CDU) value for features in the substrate;
    identifying a first range of duty cycles that corresponds to a range of CD values that includes a minimum CD value from the measured CD values in the plurality of tests;
    identifying a second range of duty cycles that corresponds to a range of CDU values that includes a minimum CDU value from the measured CDU values in the plurality of tests;
    selecting a first duty cycle from an overlap of the first range of duty cycles and the second range of duty cycles; and
    setting the selected first duty cycle in the operation of the recipe for processing the substrate.

2. The method as recited in claim 1, wherein the first range of duty cycles corresponds to duty cycles for CDU values within a range based on the minimum CDU value and a first predetermined threshold; and
    wherein the second range of duty cycles corresponds to duty cycles for CD values within a range based on the minimum CD value and a second predetermined threshold.

3. The method as recited in claim 2, wherein the first predetermined threshold is a first predetermined percentage of the minimum CDU value and the second predetermined threshold is a second predetermined percentage of the minimum CD value.

4. The method as recited in claim 1, wherein the operation is an etching operation for photolithography etching, wherein the substrate includes a plurality of holes disposed on a matrix pattern.

5. The method as recited in claim 4, wherein the substrate is processed to create a random access memory chip, wherein the plurality of holes are associated with memory cells.

6. The method as recited in claim 1, wherein the CD value is a size of a minimum feature defined in the substrate, wherein the CDU value is measured as a standard deviation of measurements of the CD values in features of a processed substrate.

7. The method as recited in claim 1, wherein the substrate includes a hole, wherein the operation alternates deposition and etching on the hole, wherein during the operation the hole shrinks until a size of the hole reaches a threshold value that remains substantially stable due to a balancing effect of the etching and the deposition.

8. The method as recited in claim 1, further including:
    tuning a ratio of gases utilized in the operation for optimizing CD values and CDU values.

9. The method as recited in claim 1, wherein the chamber is a transformer coupled plasma (TCP) chamber, wherein a TCP coil over the chamber supplies the pulsed RF to the chamber.

10. The method as recited in claim 1, wherein the operation includes injecting gases into the chamber through an edge injector, wherein the gases include nitrogen, CF4, CHF3, and Argon.

11. The method as recited in claim 1, wherein the duty cycle for the pulsed RF is a percentage of time that the pulsed RF is ON during a signal cycle.

12. A system comprising:
    a chamber for processing a substrate;
    a generator for providing pulsed radio frequency (RF) to the chamber; and
    a controller configured to:
        set parameters of the chamber and the pulsed RF for processing the substrate;
        identify an operation of a recipe for processing the substrate; and
        perform a plurality of tests in the chamber for the operation, each test having a duty cycle for the pulsed RF selected from a plurality of RF duty cycles;
    wherein the controller is further configured to:
        measure a critical dimension (CD) value and a critical dimension uniformity (CDU) value for features in the substrate for each test;
        identify a first range of duty cycles that corresponds to a range of CD values that includes a minimum CD value from the measured CD values in the plurality of tests;
        identify a second range of duty cycles that corresponds to a range of CDU values that includes a minimum CDU value from the measured CDU values in the plurality of tests;
        select a first duty cycle from an overlap of the first range of duty cycles and the second range of duty cycles; and
        set the selected first duty cycle in the operation of the recipe for processing the substrate.

13. The system as recited in claim 12, wherein the first range of duty cycles corresponds to duty cycles for CDU values within a range based on the minimum CDU value and a first predetermined threshold, wherein the first predetermined threshold is a first predetermined percentage of the minimum CDU value; and
    wherein the second range of duty cycles corresponds to duty cycles for CD values within a range based on the minimum CD value and a second predetermined threshold, wherein the second predetermined threshold is a second predetermined percentage of the minimum CD value.

14. The system as recited in claim 12, wherein the operation is an etching operation for photolithography etching, wherein the substrate includes a plurality of holes disposed on a matrix pattern.

15. The system as recited in claim 14, wherein the substrate is processed for creating a random access memory chip, wherein the holes are associated with memory cells, wherein the CD value is a size of a minimum feature defined in the substrate, wherein the CDU value is measured as a standard deviation of measurements of the CD values in features of a processed substrate.

16. The system as recited in claim 12, wherein the substrate includes a hole, wherein the operation alternates deposition and etching on the hole, wherein during the operation the hole shrinks until a size of the hole reaches a threshold value that remains substantially stable due to a balancing effect of the etching and the deposition.

17. A non-transitory computer-readable storage medium storing a computer program, the computer-readable storage medium comprising:
- program instructions for identifying an operation of a recipe for processing a substrate within a chamber, the operation being configured to provide a pulsed radio frequency (RF) to the chamber;
- program instructions for performing a plurality of tests in the chamber for the operation utilizing the pulsed RF, each test having a duty cycle for the pulsed RF selected from a plurality of RF duty cycles;
- program instructions for measuring a critical dimension (CD) value and a critical dimension uniformity (CDU) value for features in the substrate for each test;
- program instructions for identifying a first range of duty cycles that corresponds to a range of CD values that includes a minimum CD value from the measured CD values in the plurality of tests;
- program instructions for identifying a second range of duty cycles that corresponds to a range of CDU values that includes a minimum CDU value from the measured CDU values in the plurality of tests;
- program instructions for selecting a first duty cycle from an overlap of the first range of duty cycles and the second range of duty cycles; and
- program instructions for setting the selected first duty cycle in the operation of the recipe for processing the substrate.

18. The storage medium as recited in claim 17, wherein the first range of duty cycles corresponds to duty cycles for CDU values within a range based on the minimum CDU value and a first predetermined threshold, wherein the first predetermined threshold is a first predetermined percentage of the minimum CDU value; and
wherein the second range of duty cycles corresponds to duty cycles for CD values within a range based on the minimum CD value and a second predetermined threshold, wherein the second predetermined threshold is a second predetermined percentage of the minimum CD value.

19. The storage medium as recited in claim 17, wherein the operation is an etching operation for photolithography etching, wherein the substrate includes a plurality of holes disposed on a matrix pattern, wherein the substrate is processed for creating a random access memory chip, wherein the holes are associated with memory cells.

20. The storage medium as recited in claim 17, wherein the CD value is a size of a minimum feature defined in the substrate, wherein the CDU value is measured as a standard deviation of measurements of the CD values in features of a processed substrate.

* * * * *